United States Patent
Yun

(10) Patent No.: US 7,668,021 B2
(45) Date of Patent: Feb. 23, 2010

(54) SEMICONDUCTOR MEMORY DEVICE INCLUDING OUTPUT DRIVER

(75) Inventor: Tae-Sik Yun, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/003,682

(22) Filed: Dec. 31, 2007

(65) Prior Publication Data

US 2009/0003086 A1 Jan. 1, 2009

(30) Foreign Application Priority Data

Jun. 26, 2007 (KR) ...................... 10-2007-0063308

(51) Int. Cl.
*G11C 7/10* (2006.01)
(52) U.S. Cl. ............................ 365/189.05; 365/189.06; 365/189.11; 326/83; 326/85; 326/87
(58) Field of Classification Search ............ 365/189.05, 365/189.06, 189.11
See application file for complete search history.

(56) References Cited

U.S. PATENT DOCUMENTS

| | | | | |
|---|---|---|---|---|
| 5,621,335 A | * | 4/1997 | Andresen | 326/30 |
| 5,926,651 A | * | 7/1999 | Johnston et al. | 710/52 |
| 6,194,913 B1 | * | 2/2001 | Verkinderen et al. | 326/83 |
| 6,442,716 B1 | * | 8/2002 | Kim | 714/718 |
| 6,583,659 B1 | * | 6/2003 | Kwong et al. | 327/295 |
| 7,005,886 B2 | * | 2/2006 | Linam | 326/30 |
| 7,009,435 B2 | * | 3/2006 | Cho et al. | 327/170 |
| 7,015,721 B2 | * | 3/2006 | Nguyen et al. | 326/83 |
| 7,119,549 B2 | * | 10/2006 | Lee et al. | 324/601 |
| 7,173,470 B2 | | 2/2007 | Murden et al. | |
| 7,202,702 B2 | | 4/2007 | Arnold et al. | |
| 7,295,047 B2 | | 11/2007 | Lee et al. | |
| 7,466,167 B2 | * | 12/2008 | Visser et al. | 327/108 |
| 7,466,601 B2 | * | 12/2008 | Muller | 365/189.05 |

FOREIGN PATENT DOCUMENTS

| | | | |
|---|---|---|---|
| JP | 2005-182994 | | 7/2005 |
| JP | 2008017138 A | * | 1/2008 |
| KR | 10-2005-97280 | | 10/2005 |
| KR | 10-2006-0096696 | | 9/2006 |
| WO | WO 99/48260 | * | 9/1999 |

OTHER PUBLICATIONS

Korean Office Action, with English Translation, issued in Korean Patent Application No. KR 10-2007-0063308 dated on Jun. 26, 2008.

* cited by examiner

*Primary Examiner*—Viet Q Nguyen
(74) *Attorney, Agent, or Firm*—IP & T Law Firm PLC

(57) ABSTRACT

A semiconductor memory device has a data output device. The data output device is provided with a slew rate control unit for detecting the number of transitions of a plurality of output data to output slew rate control information; and an output driving unit for driving the plurality of output data with a pull-up drivability and a pull-down drivability adjusted based on the slew rate control information.

23 Claims, 11 Drawing Sheets

US 7,668,021 B2

SEMICONDUCTOR MEMORY DEVICE INCLUDING OUTPUT DRIVER

CROSS-REFERENCE TO RELATED APPLICATIONS

The present invention claims priority of Korean patent application number 10-2007-0063308, filed on Jun. 26, 2007, which is incorporated by reference in its entirety.

BACKGROUND OF THE INVENTION

The present invention relates to a semiconductor device, and more particularly, to a semiconductor memory device including an output driver for outputting internal data to external.

A semiconductor memory device includes millions of memory cells. The semiconductor memory device basically performs a write operation to the memory cells and an input/output operation for reading out stored data of the memory cell to output them to external. To read out the stored data from the memory cell, the semiconductor memory device requires an output driver for outputting the stored data to the external.

FIG. 1 is a block diagram of a conventional output driver in a semiconductor memory device.

As shown, the conventional output driver includes a pre-driver 110 and a push-pull amplifier 120. The pre-driver 110 defines a logic state of an output data signal OUT and maintains the push-pull amplifier 120 of a high impedance (HI-Z) state when the output data signal OUT is not outputted. Herein, a first operating voltage VDDQ is a power source voltage having a high voltage, and a second operating voltage VSSQ is a ground voltage having a low voltage.

In the pre-driver 110, a signal at an up-data input node UP_DATA maintains a logic high level when the output data signal OUT is outputted as a logic high level, and a signal at a down-data input node DOWN_DATA maintains a logic low level when the output data signal OUT is outputted as a logic low level.

When the signal at the up-data input node UP_DATA becomes a logic low level and the signal at the down-data input node DOWN_DATA becomes a logic high level, all transistors included in the push-pull amplifier 120 are turned off. As a result, the output data signal OUT becomes a high impedance (HI-Z) state so that the output data is not outputted.

When both signals of the up-data input node UP_DATA and the down-data input node DOWN_DATA become a logic high level, a PMOS transistor of the push-pull amplifier 120 is turned on but an NMOS transistor of the push-pull amplifier 120 is turned off. As a result, the output data signal OUT is outputted with a logic high level.

When both signals of the up-data input node UP_DATA and the down-data input node DOWN_DATA become a logic low level, the PMOS transistor of the push-pull amplifier 120 is turned off but the NMOS transistor of the push-pull amplifier 120 is turned on. As a result, the output data signal OUT is outputted with a logic low level.

In general, a slew rate can be represented by a slop of the output data signal showing the ratio of a voltage to a time. For example, the slew rate may be expressed as "3V/ns" denoting a speed activated with amplitude of 3 V during 1 ns.

To transfer data between a semiconductor memory device and a system using the semiconductor memory device at high speed, an output driver of the semiconductor memory device maintains a uniform drivability. Thus, a maximum value and a minimum value of the slew rate of the output driver is preset, and the slew rate of the output driver should be larger than the maximum value regardless of logic states of the output data. On the contrary, if the slew rate of the output driver is too larger, current consumption of the output driver instantaneously increases. As a result, an operating voltage decreases and a ringing phenomenon occurs due to resistance and inductance of a power line. Accordingly, it is important to uniformly maintain the slew rate of the output driver.

SUMMARY OF THE INVENTION

Embodiments of the present invention are directed to a semiconductor memory device having a data output device capable of uniformly maintaining a slew rate by detecting transitions of output data to control the slew rate.

In accordance with a first aspect of the present invention, there is provided a data output device, including: a slew rate control unit for detecting a transition number (which means the number of transitions) of a plurality of output data to output slew rate control information; and an output driving unit for driving the plurality of output data with a pull-up drivability and a pull-down drivability adjusted in response to the slew rate control information.

In accordance with a second aspect of the present invention, there is provided a semiconductor memory device, including: a plurality of memory cells for string a plurality of data; a plurality of data input/output (I/O) lines for transferring the plurality of data; and a data output device for detecting the transition number of the plurality of data loaded on the plurality of data I/O lines to drive the plurality of data with a pull-up drivability and a pull-down drivability adjusted based on the transition number.

DESCRIPTION OF SPECIFIC EMBODIMENTS

Hereinafter, a semiconductor memory device having a data output device capable of uniformly maintaining a slew rate in accordance with exemplary embodiments of the present invention will be described in detail with reference to the accompanying drawings.

Figure 1:
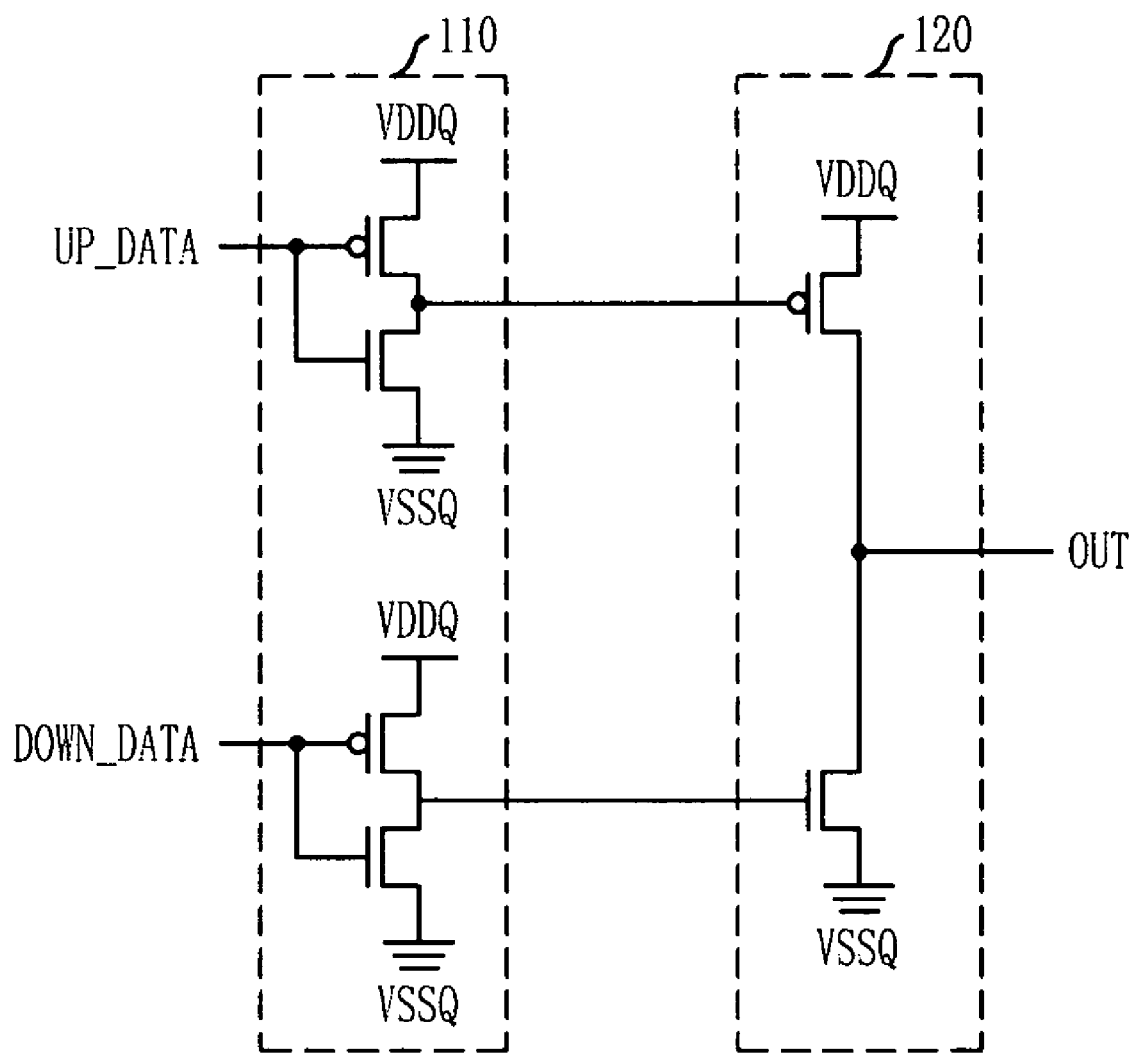
FIG. 1 is a block diagram of a conventional output driver in a semiconductor memory device.
Figure 2:
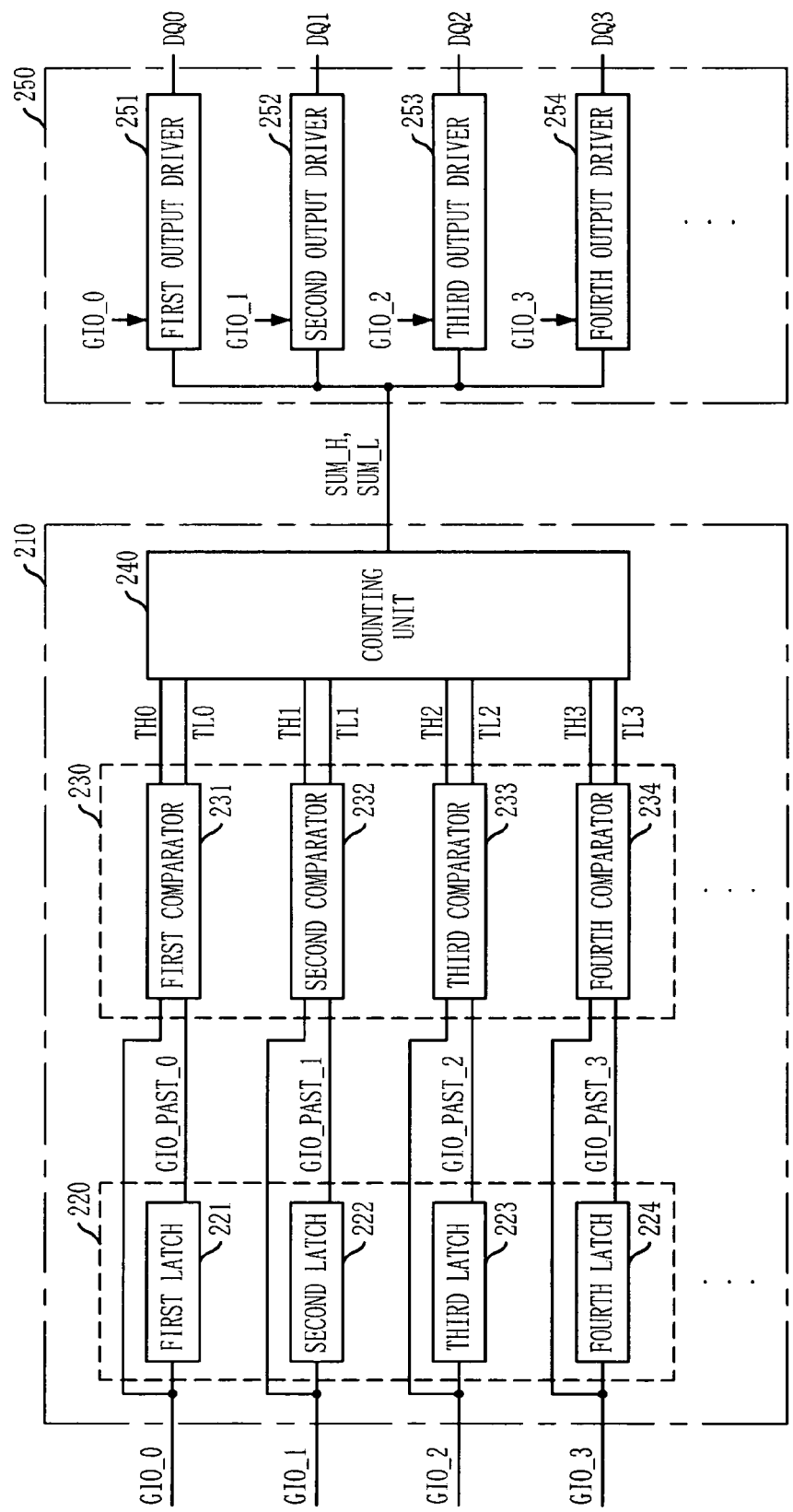
FIG. 2 is a block diagram of a data output device in a semiconductor device in accordance with an embodiment of the present invention.

FIG. 2 is a block diagram of a data output device in a semiconductor device in accordance with an embodiment of the present invention.

As shown, the data output device includes a slew rate control unit 210 and an output driving unit 250. The slew rate control unit 210 detects the transited number of a plurality of data (Hereinafter, referring to as "the transition number") and outputs slew rate control information. The output driving unit 250 includes first to fourth output drivers 251, 252, 253, and 254, each output driver driving a corresponding one of the data with a pull-up drivability and a pull-down drivability which are adjusted based on the slew rate control information.

The slew rate control unit 210 detects the transition number of a plurality of output data GIO_0, GIO_1, GIO_2, and GIO_3 which are outputted at the output drivers 251 to 254, and outputs the slew rate control information. The slew rate control information includes an up slew rate control signal SUM_H and a down slew rate control signal SUM_L. The up slew rate control signal SUM_H is generated based on information relating to data transited from a logic low level to a logic high level, and the down slew rate control signal SUM_L is generated based on information relating to data transited from a logic high level to a logic low level.

In detail, the slew rate control unit 210 includes a latch unit 220, a comparing unit 230 and a counting unit 240.

The latch unit 220 includes first to fourth latches 221, 222, 223 and 224 to latch the plurality of output data GIO_0 to GIO_3 and output a plurality of past output data GIO_PAST_0 to GIO_PAST_3.

The comparing unit 230 includes first to fourth comparators 231, 232, 233 and 234 to compare the past output data GIO_PAST_0 to GIO_PAST_3 with the present output data GIO_0 to GIO_3 and output transition information to the counting unit 240. The transition information includes a plurality of high transition signals TH0 to TH3 and a plurality of low transition signals TL0 to TL3. The high transition signals TH0 to TH3 have information relating to transitions from a logic low level to a logic high level, and the low transition signals TL0 to TL3 have information relating to transitions from a logic high level to a logic low level.

The counting unit 240 counts the number of the transitions from a logic low level to a logic high level, i.e., counting the number of enabled ones of the high transition signals TH0 to TH3, to output the up slew rate control signal SUM_H. In addition, the counting unit 240 counts the number of the transitions from a logic high level to a logic low level, i.e., counting the number of enabled ones of the low transition signals TL0 to TL3, to output the down slew rate control signal SUM_L.

The output drivers 251 to 254 adjusts the pull-up drivability and the pull-down drivability based on the up slew rate control signal SUM_H and the down slew rate control signal SUM_L to output the output data GIO_0 to GIO_3 through a plurality of data output pins DQ0 to DQ3 to external.

In FIG. 2, the output data GIO_0 to GIO_3 outputted from the data output device is explained as data loaded on a global input/output (I/O) line GIO. This means that the data output device is applied to a semiconductor memory device. For reference, the global I/O line GIO can be a data I/O line for transferring data from a memory cell of the semiconductor memory device to the data output device, and the data output device of the semiconductor memory device outputs the data via the DQ pins DQ0 to DQ3 to the external.

Figure 3:
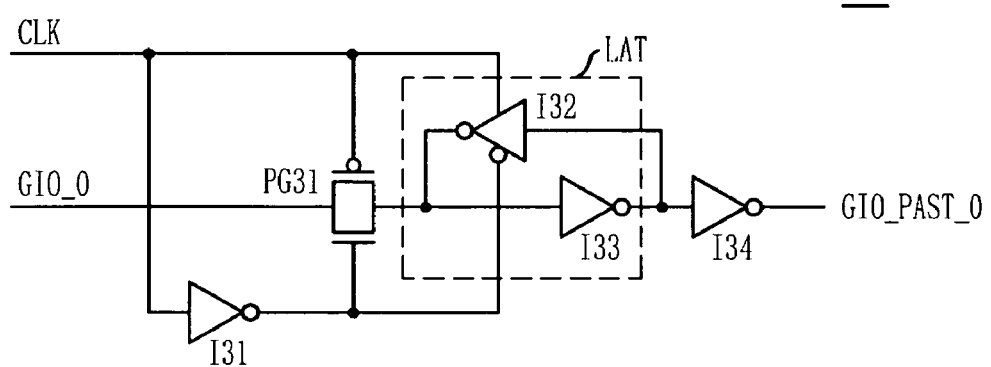
FIG. 3 is a circuit diagram of a first latch shown in FIG. 2.

FIG. 3 is a circuit diagram of the first latch 221 shown in FIG. 2. The other latches 222 to 224 have substantially the same structures as that of the first latch 221.

As shown, the first latch 221 includes a pass gate PG31 turned on and off in response to a clock signal CLK, an inverter latch LAT for latching an output of the pass gate PG31, and an inverter I34 for inverting an output of the inverter latch LAT. The inverter latch LAT includes a 3-state inverter I32 turned on and off in response to the clock signal CLK, and a second inverter I33 whose input terminal is connected to an output terminal of the first inverter I32 and whose output terminal is connected to an input terminal of the first inverter I32.

When the pass gate PG31 is turned on in response to a logic low level of the clock signal CLK, the inverter latch LAT receives and latches a first present output data GIO_0 in response to a logic high level of the clock signal CLK. The inverter I34 inverts the latched data and outputs it as a first past output data GIO_PAST_0.

Figure 4A:
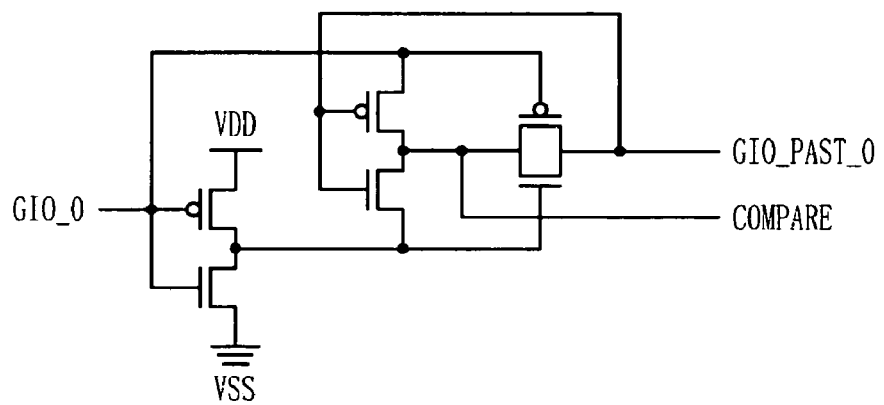
FIGS. 4A to 4C are circuit diagrams of a first comparator shown in FIG. 2.
Figure 4B:
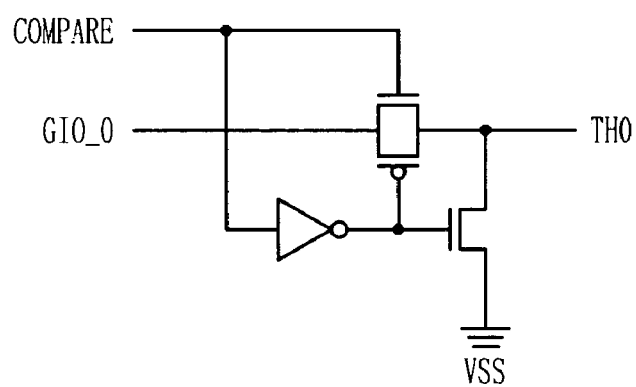
Figure 4C:
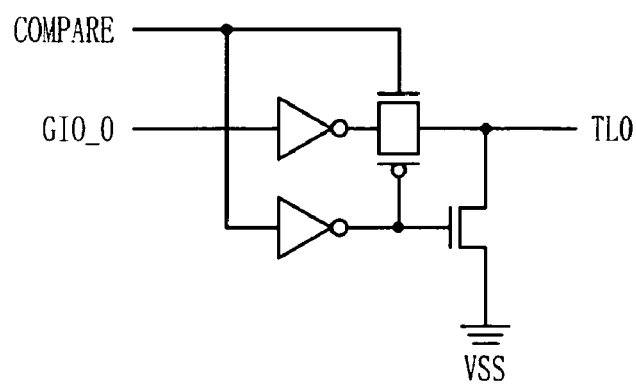

FIGS. 4A to 4C are circuit diagrams of the first comparator 231 shown in FIG. 2. The other comparators 232 to 234 have substantially the same structures as that of the first comparator 231.

In detail, FIG. 4A shows a first transition detection circuit, FIG. 4B shows a second transition detection circuit, and FIG. 4C shows a third transition detection circuit. Herein, the first to third transition detection circuits comprise the first comparator 231 shown in FIG. 2.

Referring to FIG. 4A, the first transition detection circuit receives the first present output data GIO_0 and the first past output data GIO_PAST_0 to output a comparison signal COMPARE. The comparison signal COMPARE has a logic high level when a logic level the first present output data GIO_0 is different from that of the first past output data GIO_PAST_0, and has a logic low level when the logic level of the first present output data GIO_0 is substantially the same as that of the first past output data GIO_PAST_0. That is, the comparison signal COMPARE is enabled whenever the first present output data GIO_0 is transited.

Referring to FIG. 4B, the second transition decision circuit receives the first present output data GIO_0 and the comparison signal COMPARE to output a first high transition signal TH0. The second transition decision circuit outputs the first high transition signal TH0 with a logic low level when the comparison signal COMPARE is disable with a logic low level, and outputs it with a logic high level when the first present output data GIO_0 is inputted with a logic high level in an activation state of the comparison signal COMPARE. That is, the first high transition signal TH0 is enabled whenever the first present output data GIO_0 is transited from a logic low level to a logic high level.

Referring to FIG. 4C, the third transition decision circuit receives the first present output data GIO_0 and the comparison signal COMPARE to output a first low transition signal TL0. The third transition decision circuit outputs the first low transition signal TL0 with a logic low level when the comparison signal COMPARE is disable with a logic low level, and outputs it with a logic high level when the first present output data GIO_0 is inputted with a logic low level in an activation state of the comparison signal COMPARE. That is, the first low transition signal TL0 is enabled whenever the first present output data GIO_0 is transited from a logic high level to a logic low level.

FIGS. 5A to 5D are circuit diagrams of the counting unit 240 shown in FIG. 2 in accordance with a first embodiment of the present invention.

For the sake of convenience, FIGS. 5A to 5D are explained as a data output device or a semiconductor memory device having the data output device for outputting eight output data in parallel, and thus, the counting unit 240 counts first to eighth high transition signals TH0 to TH7 and first to eighth low transition signals TL0 to TL7 which are generated by comparing first to eighth present output data GIO_0 to GIO_7 with first to eighth past output data GIO_PAST_0 to GIO_PAST_7.

Figure 5A:
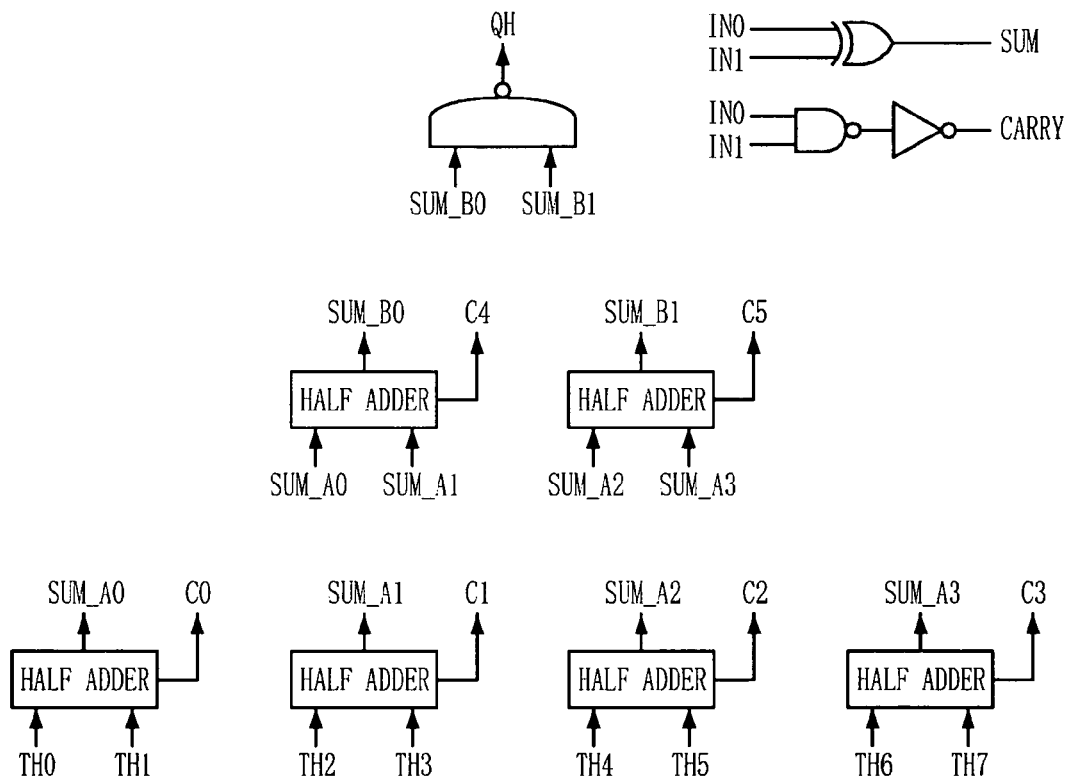
FIGS. 5A to 5D are circuit diagrams of a counting unit shown in FIG. 2 in accordance with a first embodiment of the present invention.
Figure 5B:
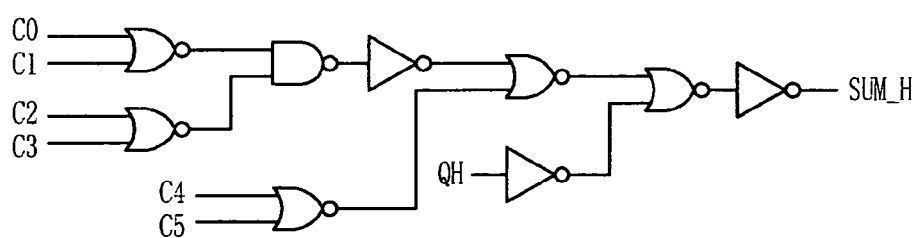
Figure 5C:
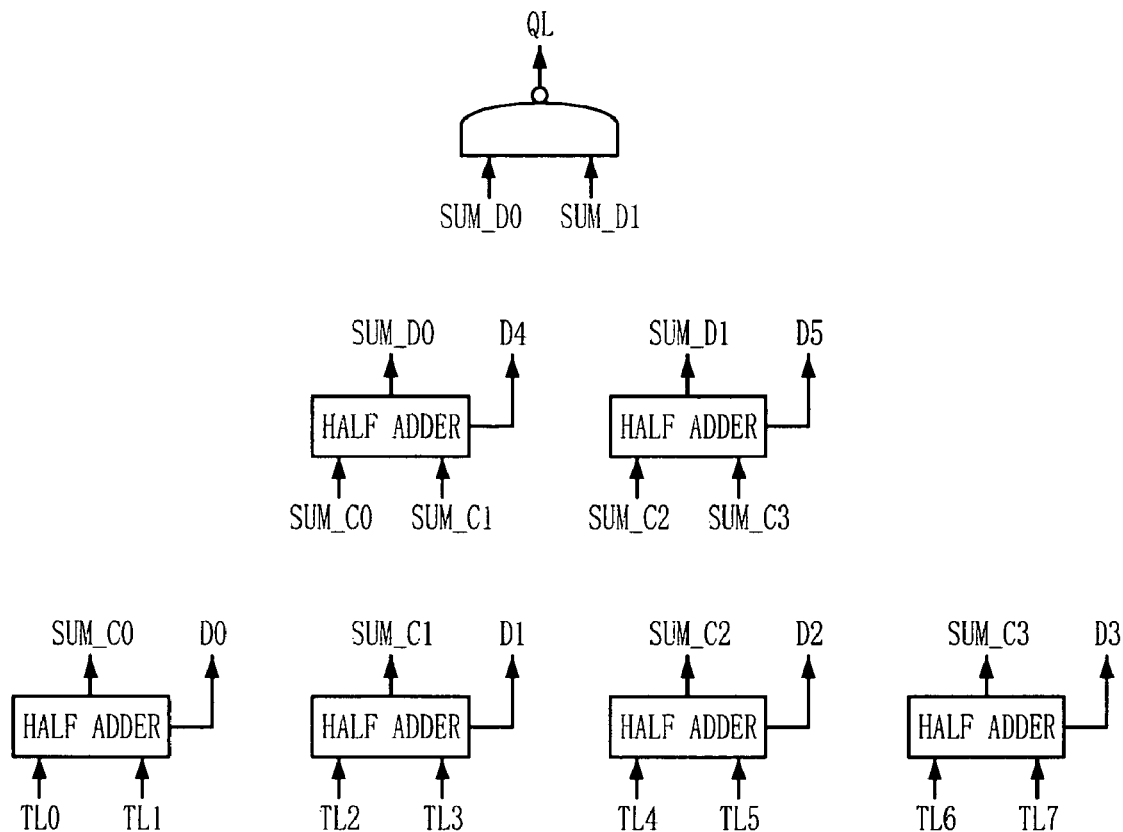
Figure 5D:
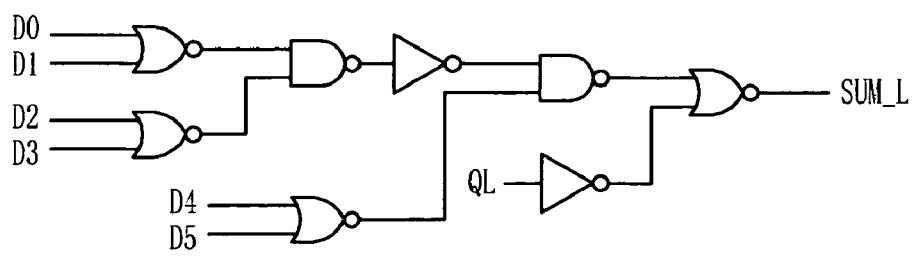

In detail, FIG. 5A shows a first counter, FIG. 5B shows a first signal generator, FIG. 5C shows a second counter, and FIG. 5D shows a second signal generator. Herein, the first and the second counters and the first and the second signal generators are implemented as the counting unit 240 shown in FIG. 2.

Referring to FIG. 5A, the first counter counts the transition number of the present output data GIO_0 to GIO_7 from a logic low level to a logic high level based on the high transition signals TH0 to TH7.

For this, the first counter includes first to sixth half-adders and a first NAND gate. The first half-adder receives the first and the second high transition signals TH0 and TH1 to output a first carry C0 and a first summation value SUM_A0. The second half-adder receives the third and the fourth high transition signals TH2 and TH3 to output a second carry C1 and a second summation value SUM_A1. The third half-adder receives the fifth and the sixth high transition signals TH4 and TH5 to output a third carry C2 and a third summation value SUM_A2. The fourth half-adder receives the seventh and the eighth high transition signals TH6 and TH7 to output a fourth carry C3 and a fourth summation value SUM_A3. The fifth half-adder receives the first and the second summation values SUM_A0 and SUM_A1 to output a fifth carry C4 and a fifth summation value SUM_B0. The sixth half-adder receives the third and the fourth summation values SUM_A2 and SUM_A3 to output a sixth carry C5 and a sixth summation value SUM_B1. The first NAND gate receives the fifth and the sixth summation values SUM_B0 and SUM_B1 to output a first result signal QH. In the right side of FIG. 5A, a detailed circuit of the half-adder is illustrated.

Referring to FIG. 5B, the first signal generator generates the up slew rate control signal SUM_H based on the first to the sixth carries C0 to C5 and the first result signal QH. The up slew rate control signal SUM_H is enabled when the transition number of the output data from a logic low level to a logic high level is larger than a predetermined value. For this, the first signal generator includes a plurality of NOR gates, NAND gates and inverters for receiving the first to the sixth carries C0 to C5 and the first result signal QH.

The up slew rate control signal SUM_H is enabled with a logic high level when any of the carries C0 to C5 has a logic high level or the first result signal QH has a logic low level. Otherwise, the up slew rate control signal SUM_H is disabled with a logic low level. That is, the up slew rate control signal SUM_H becomes a logic high level when two or more high transition signals have a logic high level, i.e., when two or more output data are transited from a logic low level to a logic high level.

Referring to FIG. 5C, the second counter counts the transition number of the present output data GIO_0 to GIO_7 from a logic high level to a logic low level based on the low transition signals TL0 to TL7.

For this, the second counter includes seventh to twelfth half-adders and a second NAND gate. The seventh half-adder receives the first and the second low transition signals TL0 and TL1 to output a seventh carry D0 and a seventh summation value SUM_C0. The eighth half-adder receives the third and the fourth low transition signals TL2 and TL3 to output an eighth carry D1 and an eighth summation value SUM_C1. The ninth half-adder receives the fifth and the sixth low transition signals TL4 and TL5 to output a ninth carry D2 and a ninth summation value SUM_C2. The tenth half-adder receives the seventh and the eighth low transition signals TL6 and TL7 to output a tenth carry D3 and a tenth summation value SUM_C3. The eleventh half-adder receives the seventh and the eighth summation values SUM_C0 and SUM_C1 to output an eleventh carry D4 and an eleventh summation value SUM_D0. The twelfth half-adder receives the ninth and the tenth summation values SUM_C2 and SUM_C3 to output a twelfth carry D5 and a twelfth summation value SUM_D1. The second NAND gate receives the eleventh and the twelfth summation values SUM_D0 and SUM_D1 to output a second result signal QL.

Referring to FIG. 5D, the second signal generator generates the down slew rate control signal SUM_L based on the seventh to the twelfth carries D0 to D5 and the second result signal QL. The down slew rate control signal SUM_L is enabled when the transition number of the output data from a logic high level to a logic low level is larger than a predetermined value. For this, the second signal generator includes a plurality of NOR gates, NAND gates and inverters for receiving the seventh to the twelfth carries D0 to D5 and the second result signal QL.

The down slew rate control signal SUM_L is enabled with a logic low level when any of the carries D0 to D5 has a logic high level or the second result signal QL has a logic low level. Otherwise, the down slew rate control signal SUM_L is disabled with a logic high level. That is, the down slew rate control signal SUM_L becomes a logic low level when two or more low transition signals have a logic high level, i.e., when two or more output data are transited from a logic high level to a logic low level.

Figure 6:
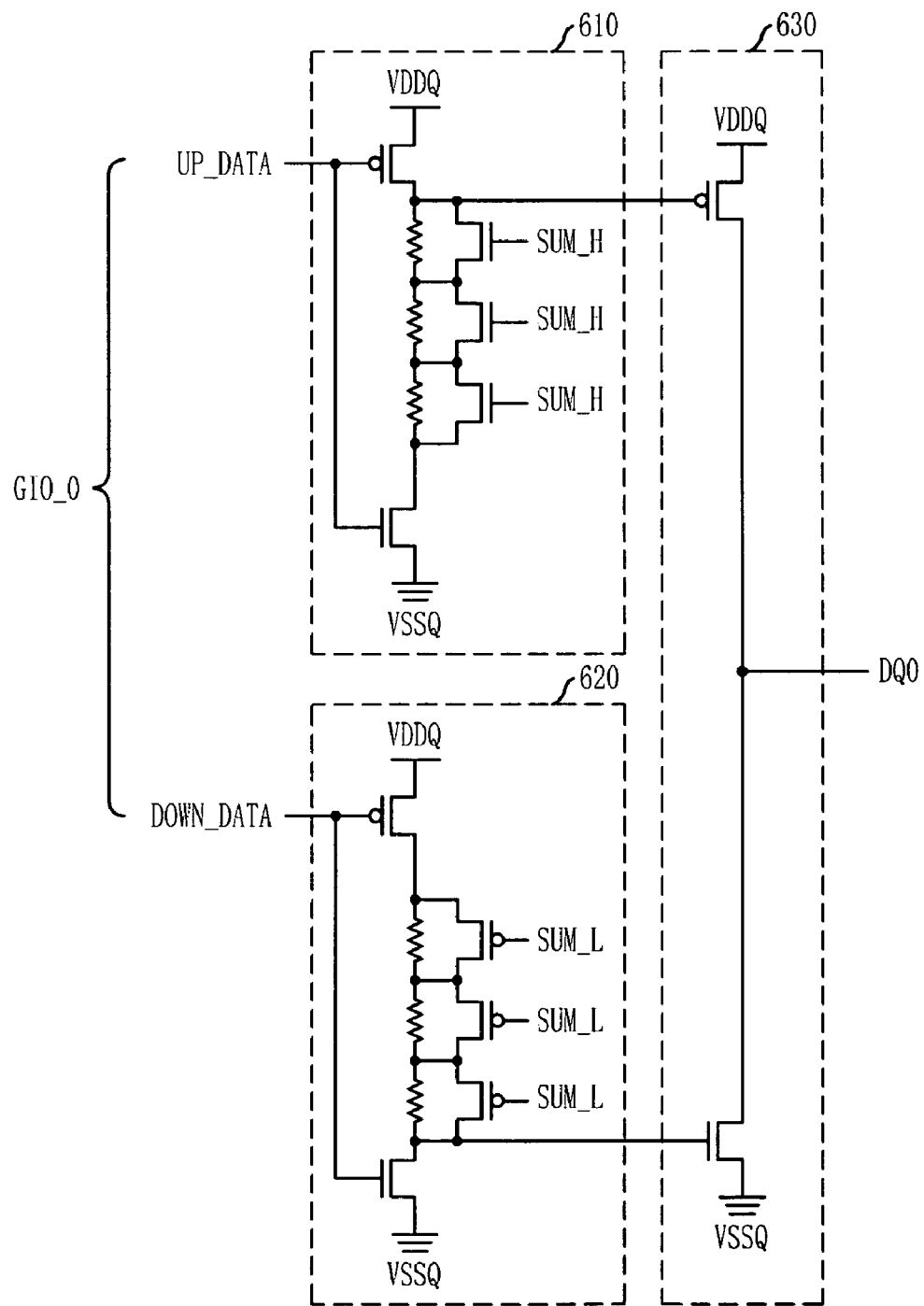
FIG. 6 is a circuit diagram of a first output driver shown in FIG. 2 in accordance with a first embodiment of the present invention.

FIG. 6 is a circuit diagram of the first output driver 251 shown in FIG. 2 in accordance with a first embodiment of the present invention. The other output drivers 252 to 254 have substantially the same structures as that of the first output driver 251.

As shown, the first output driver 251 adjusts a pull-up drivability and a pull-down drivability based on the up slew rate control signal SUM_H and the down slew rate control signal SUM_L to drive the output data GIO_0 through a first data output pin DQ0 to external.

In detail, the first output driver 251 includes a pull-up pre-driver 610, a pull-down pre-driver 620, and a push-pull amplifier 630. Herein, a drivability of the pull-up pre-driver 610 is controlled by the up slew rate control signal SUM_H, and a drivability of the pull-down pre-driver 620 is controlled by the down slew rate control signal SUM_L.

The pull-up pre-driver 610 includes a PMOS transistor and an NMOS transistor receiving the output data GIO_0 through an up-data input node UP_DATA, a plurality of pull-down NMOS transistors receiving the up slew rate control signal SUM_H, and a plurality of pull-down resistors, each coupled to a corresponding pull-down NMOS transistor in parallel.

Hereinafter, an operation of the pull-up pre-driver 610 is explained in detail.

The up slew rate control signal SUM_H becomes a logic high level if two or more output data are transited from a logic low level to a logic high level. The pull-down NMOS transistors included in the pull-up pre-driver 610 are turned on in response to the up slew rate control signal SUM_H, and the pull-down resistors are short-circuited. Accordingly, a PMOS transistor included in the push-pull amplifier 630 may be strongly turned on, and thus it is possible to increase a pull-up drivability of the push-pull amplifier 630 when two or more output data are transited from a logic low level to a logic high level.

On the contrary, the up slew rate control signal SUM_H becomes a logic low level if one or less output data are transited from a logic low level to a logic high level. The pull-down NMOS transistors included in the pull-up pre-driver 610 are turned off in response to the up slew rate control signal SUM_H, and the pull-down resistors have a predetermined resistance. Accordingly, the PMOS transistor included in the push-pull amplifier 630 may be weakly turned on, and thus it is possible to decrease the pull-up drivability of the push-pull amplifier 630 when one or less output data are transited from a logic low level to a logic high level.

The pull-down pre-driver 620 includes a PMOS transistor and an NMOS transistor receiving the output data GIO_O through a down-data input node DOWN_DATA, a plurality of pull-up PMOS transistors receiving the down slew rate control signal SUM_L, and a plurality of pull-up resistors, each coupled to a corresponding pull-up PMOS transistor in parallel.

Hereinafter, an operation of the pull-down pre-driver 620 is explained in detail.

The down slew rate control signal SUM_L becomes a logic low level if two or more output data are transited from a logic high level to a logic low level. The pull-up PMOS transistors included in the pull-down pre-driver 620 are turned on in response to the down slew rate control signal SUM_L, and the pull-up resistors are short-circuited. Accordingly, an NMOS transistor included in the push-pull amplifier 630 may be strongly turned on, and thus it is possible to increase a pull-down drivability of the push-pull amplifier 630 when two or more output data are transited from a logic high level to a logic low level.

On the contrary, the down slew rate control signal SUM_L becomes a logic low level if one or less output data are transited from a logic high level to a logic low level. The pull-up PMOS transistors included in the pull-down pre-driver 620 are turned off in response to the down slew rate control signal SUM_L, and the pull-up resistors have a predetermined resistance. Accordingly, the NMOS transistor included in the push-pull amplifier 630 may be weakly turned on, and thus it is possible to decrease the pull-down drivability of the push-pull amplifier 630 when one or less output data are transited from a logic high level to a logic low level.

As described above, when the transition number of the output data GIO_0 to GIO_7 is larger than a predetermined value, the push-pull amplifier 630 of the output driver 251 is controlled to be strongly turned on. However, when the transition number of the output data GIO_0 to GIO_7 is smaller than a predetermined value, the push-pull amplifier is controlled to be weakly turned on. This is because an operating voltage of the output driver is generally a high voltage such as VDDQ so that a sudden change in the slew rate can occur, e.g., the operating voltage can be unstable when the transition number of data is suddenly increased and the drivability is uselessly increased when the transition number of data is small. Accordingly, in the present invention, it is possible to control the slew rate by controlling the push-pull amplifier 630 to be strongly turned on in case of the large transition number of data, and weakly turned on in case of the small transition number of data.

For reference, the pull-up pre-driver 610 includes the plural pull-down NMOS transistors receiving the up slew rate control signal SUM_H, and the pull-down pre-driver 620 includes the plural pull-up PMOS transistors receiving the down slew rate control signal SUM_L as shown in FIG. 6. Thus, various options can be easily added to each pre-driver. The above pull-down NMOS transistors and pull-up PMOS transistors can be made into one transistor.

In the present invention, the up slew rate control signal SUM_H and the down slew rate control signal SUM_L may be activated with an opposite polarity by adding an inverter at the end of the first and the second signal generators shown in FIGS. 5B and 5D. That is, the drivability of the output driver is decreased when the transition number of data is larger than a predetermined value, and the drivability of the output driver is increased when the transition number of data is smaller than a predetermined value. As a result, the present invention can be implemented with various embodiments according to needs of a system using the output driver.

In the above FIGS. 5A to 6, an embodiment is explained that the counting unit 240 and the output driver 251 control the slew rate according to whether the transition number is larger than two or not. Hereinafter, another embodiment will be explained that the counting unit 240 and the output driver 251 variously control the slew rate.

Figure 7A:
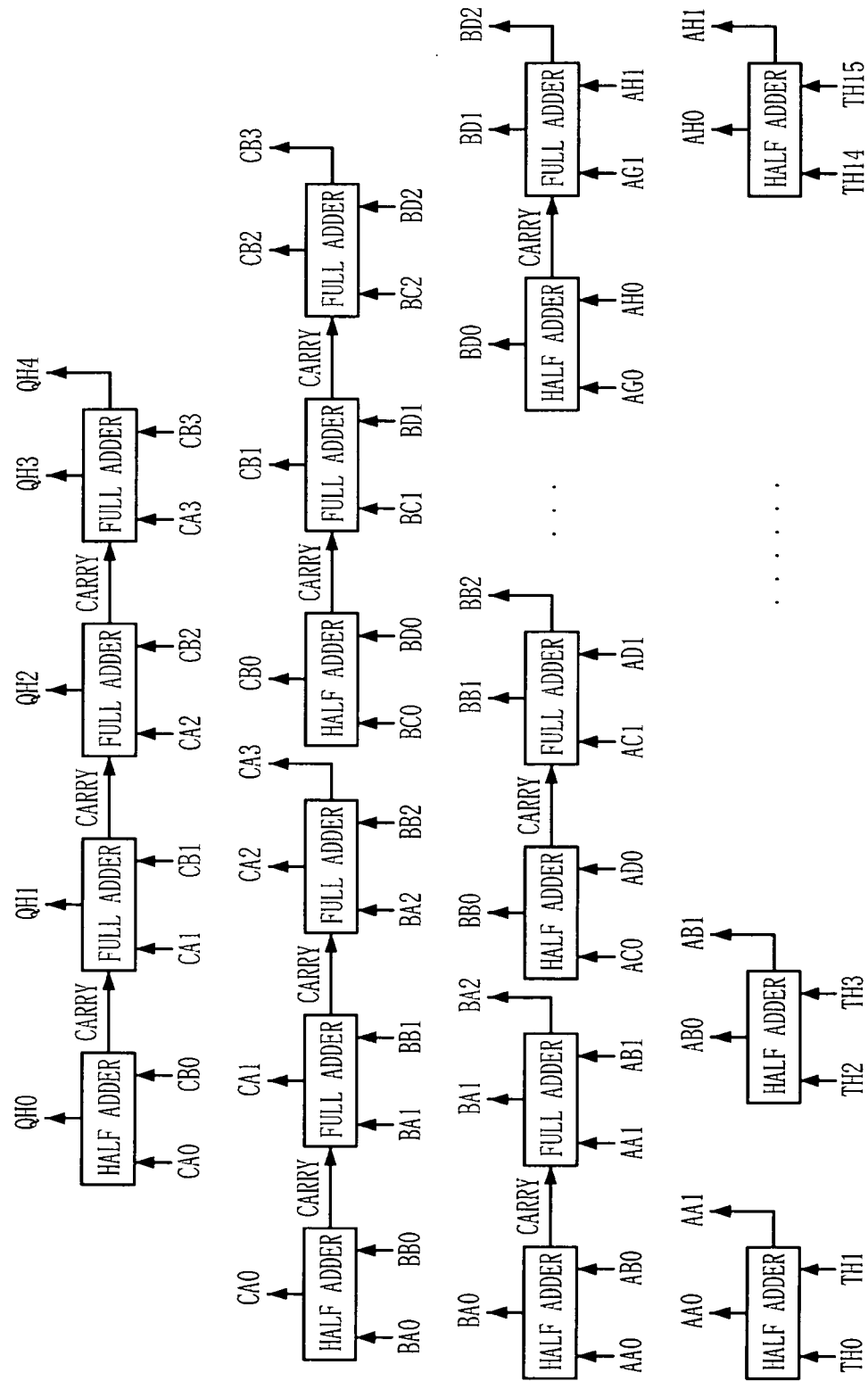
FIGS. 7A to 7C are circuit diagrams of a counting unit shown in FIG. 2 in accordance with a second embodiment of the present invention.
Figure 7B:
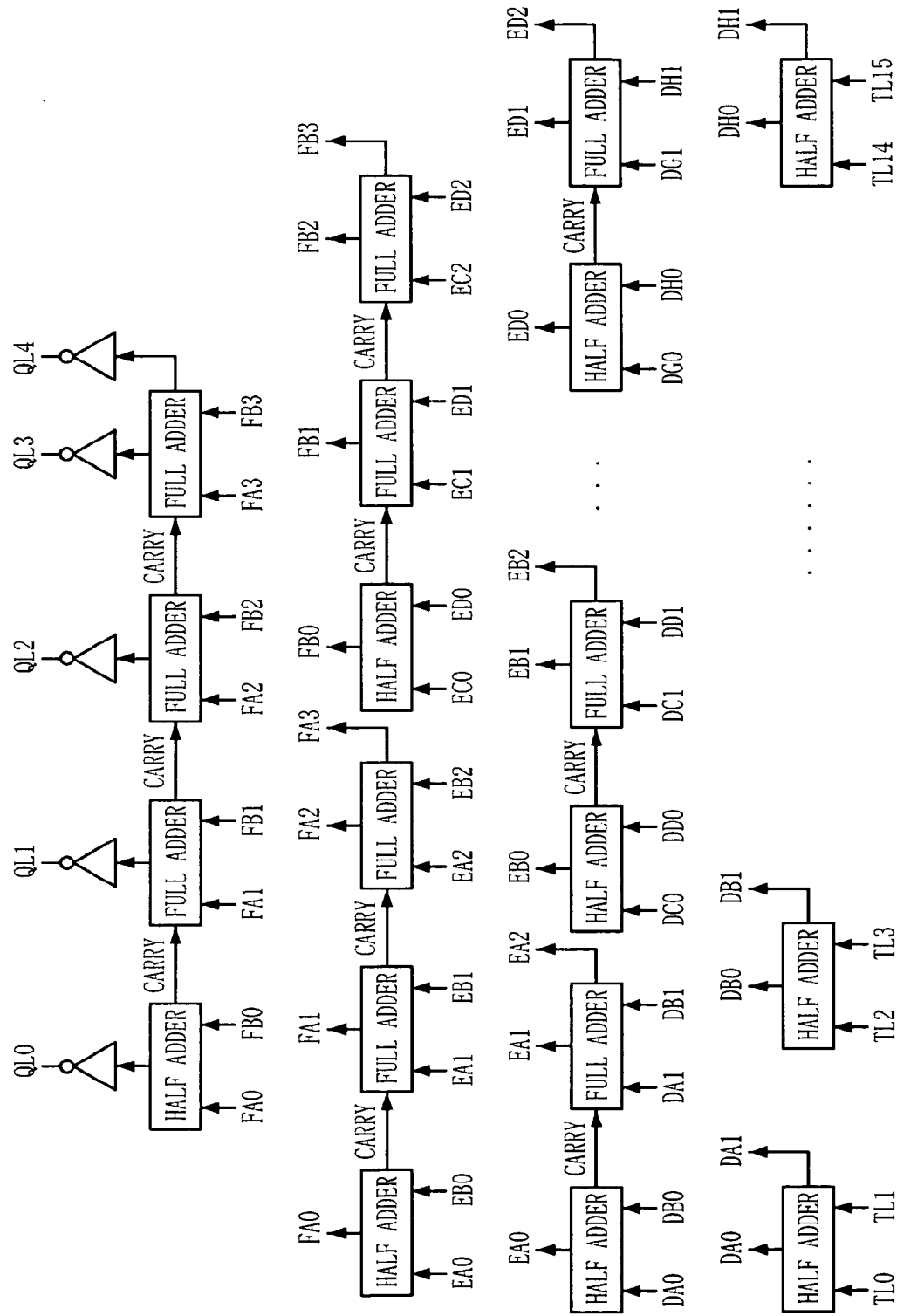
Figure 7C:
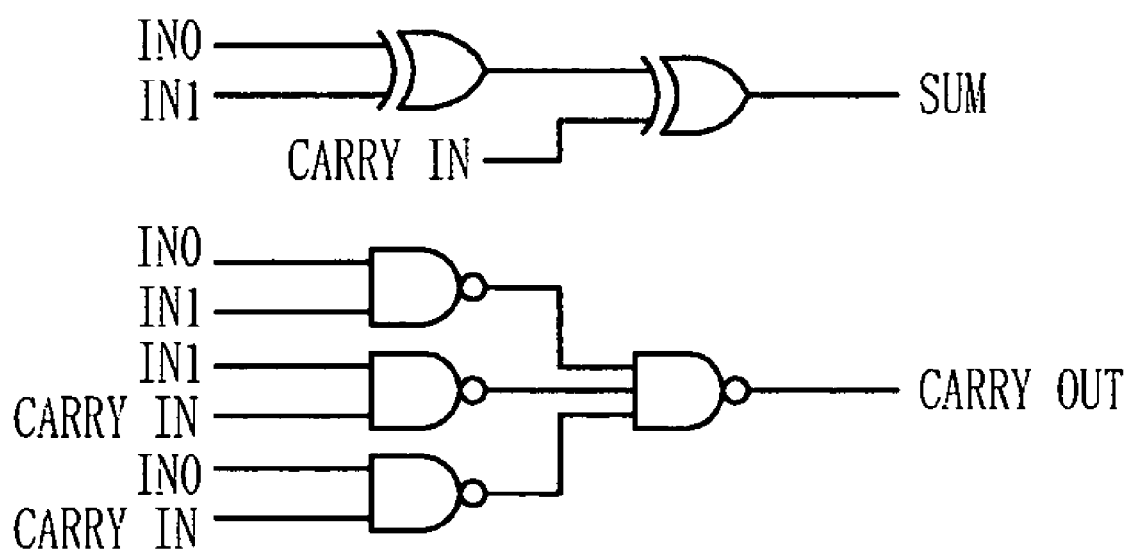

FIGS. 7A to 7C are circuit diagrams of the counting unit 240 shown in FIG. 2 in accordance with a second embodiment of the present invention.

For convenience, FIGS. 7A to 7C are explains a data output device or a semiconductor memory device having the data output device for outputting sixteen output data in parallel, and thus, the counting unit 240 counts first to sixteenth high transition signals TH0 to TH15 and first to sixteenth low transition signals TL0 to TL15 which are generated by comparing first to sixteenth present output data GIO_0 to GIO_15 with first to sixteenth past output data GIO_PAST_0 to GIO_PAST_15.

In detail, FIG. 7A shows a first counter, FIG. 7B shows a second counter, and FIG. 7C shows a full-adder included in each counter. Herein, the first and the second counters comprise the counting unit 240 shown in FIG. 2.

Referring to FIG. 7A, the first counter outputs up slew rate control information by counting the transition number of the present output data GIO_0 to GIO_15 from a logic low level to a logic high level based on the first to the sixteenth high transition signals TH0 to TH15. The up slew rate control information includes a plurality of up slew rate control signals QH0, QH1, QH2, QH3, and QH4, each enabled with a logic high level according to the transition number of output data from a logic low level to a logic high level.

For this, the first counter includes a plurality of half-adders and a plurality of full-adders. As shown, the first counter sums up the first to the sixteenth high transition signals TH0 to TH15 to output the up slew rate control signals QH0 to QH4 at the most upper portion. The up slew rate control signals QH0 to QH4 are a binary showing the number of the high transition signals having a logic high level. That is, the first counter converts the transition number of output data GIO_0 to GIO_15 from a logic low level to a logic high level into the binary to thereby output the up slew rate control signals QH0 to QH4. For reference, the full-adder may be implemented with circuits shown in FIG. 7C.

Referring to FIG. 7B, the second counter outputs down slew rate control information by counting the transition number of the present output data GIO_0 to GIO_15 from a logic high level to a logic low level based on the first to the sixteenth low transition signals TL0 to TL15. The down slew rate control information includes a plurality of down slew rate control signals QL0, QL1, QL2, QL3, and QL4, each enabled with a logic low level according to the transition number of output data from a logic high level to a logic low level.

For this, the second counter includes a plurality of half-adders, a plurality of full-adders and a plurality of inverters. As shown, the second counter sums up the first to the sixteenth low transition signals TL0 to TL15 and inverts the summing result to output the down slew rate control signals QL0 to QL4 at the most upper portion. The down slew rate control signals QL0 to QL4 are a binary showing the number of the low transition signals having a logic high level. That is, the first counter converts the transition number of output data GIO_0 to GIO_15 from a logic high level to a logic low level into the binary, and inverts the converted the binary to thereby output the down slew rate control signals QL0 to QL4.

Figure 8:
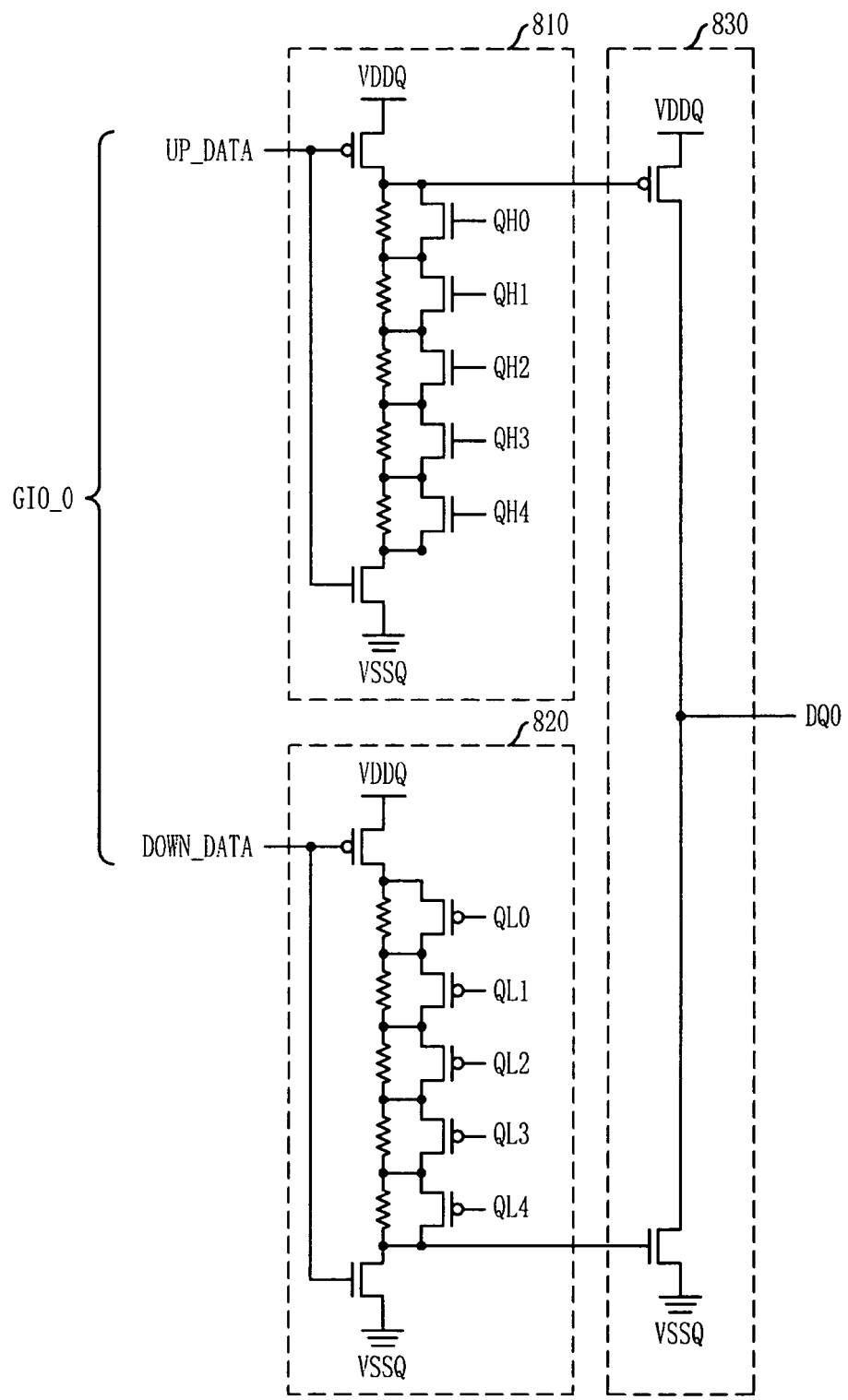
FIG. 8 is a circuit diagram of a first output driver shown in FIG. 2 in accordance with a second embodiment of the present invention.

FIG. 8 is a circuit diagram of the first output driver 251 shown in FIG. 2 in accordance with a second embodiment of the present invention. The first output driver 251 controls a slew rate based on the slew rate control information outputted from the counting unit 240 shown in FIGS. 7A to 7C.

As shown, the first output driver 251 drives the output data GIO_0 through a first data output pins DQ0 to external by adjusting a pull-up drivability and a pull-down drivability based on the up slew rate control signals QH0 to QH4 and the down slew rate control signals QL0 to QL4. The other output drivers 252 to 254 have substantially the same structures as that of the first output driver 251.

In detail, the first output driver 251 includes a pull-up pre-driver 810, a pull-down pre-driver 820, and a push-pull amplifier 830. Herein, a drivability of the pull-up pre-driver 810 is controlled by the up slew rate control signals QH0 to QH4, and a drivability of the pull-down pre-driver 620 is controlled by the down slew rate control signals QL0 to QL4.

The pull-up pre-driver 810 includes a PMOS transistor and an NMOS transistor receiving the output data GIO_O through an up-data input node UP_DATA, a plurality of pull-down NMOS transistors, and a plurality of pull-down resistors. The pull-down NMOS transistors receives a corresponding one of the up slew rate control signals QH0 to QH4. Each of the pull-down resistors is coupled to the corresponding pull-down NMOS transistor in parallel.

Hereinafter, an operation of the pull-up pre-driver 810 is explained in detail.

Each of the up slew rate control signals QH0 to QH4 becomes a logic high level as the transition number of the output data GIO_0 to GIO_15 from a logic low level to a logic high level is increased. Each of the pull-down NMOS transistors included in the pull-up pre-driver 810 is turned on in response to the corresponding up slew rate control signals QH0 to QH4, and thus the corresponding pull-down resistors are short-circuited. Accordingly, a PMOS transistor included in the push-pull amplifier 830 may be strongly turned on, and thus it is possible to increase a pull-up drivability of the push-pull amplifier 830 as the transition number of the output data from a logic low level to a logic high level is increased.

Herein, the up slew rate control signals QH0 to QH4 are a binary converted from the number of the high transition signals TH0 to TH15 so as to have different amplitude. Accordingly, each pull-down resistor coupled to the corresponding pull-down NMOS transistor in parallel is implemented with a different resistance. For example, resistance of the pull-down resistor coupled to the pull-down NMOS transistor receiving a second up slew rate control signal QH1 is twice as much as that of the pull-down resistor coupled to the pull-down NMOS transistor receiving a first up slew rate control signal QH0.

On the contrary, a few pull-down NMOS transistors receiving the up slew rate control signals QH0 to QH4 are turned on when the transition number of the output data GIO_0 to GIO_15 from a logic low level to a logic high level is few. Accordingly, the PMOS transistor included in the push-pull amplifier 830 may be weakly turned on, and thus it is possible to decrease the pull-up drivability of the push-pull amplifier 830.

The pull-down pre-driver 820 includes a PMOS transistor and an NMOS transistor receiving the output data GIO_O through a down-data input node DOWN_DATA, a plurality of pull-up PMOS transistors, and a plurality of pull-up resistors. Each of the pull-up PMOS transistors receives a corresponding one of the down slew rate control signals QL0 to QL4. Each of the pull-up resistors is coupled to a corresponding pull-up PMOS transistor in parallel.

Hereinafter, an operation of the pull-down pre-driver 820 is explained in detail.

Each of the down slew rate control signals QL0 to QL4 becomes a logic low level as the transition number of the output data GIO_0 to GIO_15 from a logic high level to a logic low level is increased. Each of the pull-up PMOS transistors included in the pull-down pre-driver 820 are turned on in response to the corresponding down slew rate control signals QL0 to QL4, and the corresponding pull-up resistors are short-circuited. Accordingly, an NMOS transistor included in the push-pull amplifier 830 may be strongly turned on, and thus it is possible to increase a pull-down drivability of the push-pull amplifier 830.

Herein, the down slew rate control signals QL0 to QL4 are a binary converted from the number of the low transition signals TL0 to TL15 so as to have different amplitude. Accordingly, each pull-up resistor coupled to the corresponding pull-up PMOS transistor in parallel is implemented with a different resistance. For example, resistance of the pull-up resistor coupled to the pull-up PMOS transistor receiving a second down slew rate control signal QL1 is twice as much as that of the pull-up resistor coupled to the pull-up PMOS transistor receiving a first down slew rate control signal QL0.

On the contrary, a few pull-up PMOS transistors receiving the down slew rate control signals QL0 to QL4 are turned on when the transition number of the output data GIO_0 to GIO_15 from a logic high level to a logic low level is few. Accordingly, the NMOS transistor included in the push-pull amplifier 830 may be weakly turned on, and thus it is possible to decrease the pull-up drivability of the push-pull amplifier 830.

As described above, the push-pull amplifier 630 of the output driver 251 is controlled to be strongly turned on as the transition number of the output data GIO_0 to GIO_7 is increased, and the push-pull amplifier is controlled to be weakly turned on as the transition number of the output data GIO_0 to GIO_7 is decreased. As compared with the data output device shown in FIGS. 5A to 6, the data output device shown in FIGS. 7A to 8 can elaborately control the slew rate.

Likewise, in another embodiment of the present invention, the up slew rate control signals QH0 to QH4 and the down slew rate control signals QL0 to QL4 may be activated with an opposite polarity by adding an inverter at the end of the first and the second counters shown in FIGS. 7A and 7B. That is, the drivability of the output driver is decreased as the transition number of data is increased, and the drivability of the output driver is increased as the transition number of data is decreased. As a result, the present invention can be implemented with various embodiments according to needs of a system using the output driver.

As described above, a data output device in accordance with the present invention can control a drivability of an output driver by detecting transitions of output data. Accordingly, it is possible to automatically and appropriately adjust a slew rate when the data output device is applied to a semiconductor memory device and other systems, thereby satisfying requirements for maximum and minimum slew rate in the semiconductor memory device and the other systems.

While the present invention has been described with respect to the specific embodiments, it will be apparent to those skilled in the art that various changes and modifications may be made without departing from the spirit and scope of the invention as defined in the following claims.

What is claimed is:

1. A data output device, comprising:
   a slew rate control unit for detecting the number of transitions of a plurality of output data to output slew rate control information;
   an amplifier for amplifying and outputting the output data;
   a pull-up pre-driver for controlling a drivability of the amplifier by adjusting resistance provided in the pull-up pre-driver in response to the slew rate control information; and
   a pull-down pre-driver for controlling a drivability of the amplifier by adjusting resistance provided in the pull-down pre-driver in response to the slew rate control information.

2. The data output device as recited in claim 1, wherein the slew rate control information includes up slew rate control information and down slew rate control information.

3. The data output device as recited in claim 2, wherein the up slew rate control information is generated based on the number of transitions of output data from a logic low level to a logic high level.

4. The data output device as recited in claim 2, wherein the down slew rate control information is generated based on the number of transitions of output data from a logic high level to a logic low level.

5. The data output device as recited in claim 2, wherein the slew rate control unit includes:
   a latch unit for latching the plurality of output data and outputting a plurality of past output data;
   a comparing unit for comparing the past output data with the output data and detecting a transition from a logic level high to a logic level low and a transition from a logic level low to a logic level high; and
   a counting unit for counting the number of transitions from a logic low level to a logic high level to output the up slew rate control information, and counting the number of transitions from a logic high level to a logic low level to output the down slew rate control information.

6. The data output device as recited in claim 5, wherein the comparing unit includes a plurality of comparators, each comparator including:
   a first transition decision unit for detecting the transitions of corresponding output data by comparing the corresponding past output data with the corresponding output data;
   a second transition decision unit for outputting a high transition signal representing that the corresponding output data is transited from a logic low level to a logic high level; and
   a third transition decision unit for outputting a low transition signal representing that the corresponding output data is transited from a logic high level to a logic low level.

7. The data output device as recited in claim 1, wherein
   the up slew rate control information includes an up slew rate control signal enabled when the number of transitions of the output data from a logic low level to a logic high level is larger than a predetermined value, for controlling the drivability of the pull-up pre-driver by adjusting resistance provided in the pull-up pre-driver; and
   the down slew rate control information includes a down slew rate control signal enabled when the number of transitions of the output data from a logic high level to a logic low level is larger than a predetermined value, for controlling the drivability of the pull-down pre-driver by adjusting resistance provided in the pull-down pre-driver.

8. The data output device as recited in claim 5, wherein the counting unit includes:
   a first counter for counting the number of transitions of the output data from a logic low level to a logic high level;
   a first signal generator for generating the up slew rate control signal in response to an output of the first counter when the number of transitions is more than the predetermined value;
   a second counter for counting the number of transitions of the output data from a logic high level to a logic low level; and
   a second signal generator for generating the down slew rate control signal based on an output of the second counter when the number of transitions is more than the predetermined value.

9. The data output device as recited in claim 8, wherein the first and the second counters includes a plurality of half-adders.

10. The data output device as recited in claim 1, wherein the up slew rate control information includes a plurality of up slew rate control signals, each signal activated according to the number of transitions of the output data from a logic low level to a logic high level, for controlling the drivability of the pull-up pre-driver by adjusting resistance provided in the pull-up pre-driver; and
   the down slew rate control information includes a plurality of down slew rate control signals, each signal activated according to the number of transitions of the output data from a logic high level to a logic low level, for controlling the drivability of the pull-down pre-driver by adjusting resistance provided in the pull-down pre-driver.

11. The data output device as recited in claim 5, wherein the counting unit includes:
   a first counter including a plurality of half-adders and full-adders, for outputting the plurality of up slew rate control signals; and
   a second counter including a plurality of half-adders and full-adders, for outputting the plurality of down slew rate control signals.

12. A semiconductor memory device, comprising:
   a plurality of memory cells for storing a plurality of data;
   a plurality of data input/output (I/O) lines for transferring the plurality of data between the plurality of memory cells and an outside of the semiconductor memory device; and
   a data output device for detecting the number of transitions of the plurality of data transferred by the plurality of data I/O lines to drive the plurality of data with a pull-up drivability and a pull-down drivability adjusted based on the number of transitions,
   wherein the data output device comprises:
      an amplifier for amplifying and outputting the data,
      a pull-up pre-driver for controlling a drivability of the amplifier by adjusting resistance provided in the pull-up pre-driver in response to the slew rate control information, and
      a pull-down pre-driver for controlling a drivability of the amplifier by adjusting resistance provided in the pull-down pre-driver in response to the slew rate control information.

13. The semiconductor memory device as recited in claim 12, wherein the data I/O lines includes a global I/O line.

14. The semiconductor memory device as recited in claim 12, wherein the data output device outputs the plurality of data through data output (DQ) pins.

15. The semiconductor memory device as recited in claim 12, wherein the data output device includes:
   a slew rate control unit for detecting the number of transitions of the plurality of data and outputting slew rate control information.

16. The semiconductor memory device as recited in claim 12, wherein the slew rate control information includes up slew rate control information generated based on the number of transitions of the plurality of data from a logic low level to a logic high level, and down slew rate control information generated based on the number of transitions of the plurality of data from a logic high level to a logic low level.

17. The semiconductor memory device as recited in claim 15, wherein the slew rate control unit includes:
   a latch unit for latching the plurality of data and outputting a plurality of past data;
   a comparing unit for comparing the past data with the data and detecting a transition from a logic level high to a logic level low and a transition from a logic level low to a logic level high; and
   a counting unit for counting the number of transitions from a logic low level to a logic high level to output the up slew rate control information, and counting the number of transitions from a logic high level to a logic low level to output the down slew rate control information.

18. The semiconductor memory device as recited in claim 17, wherein the comparing unit includes a plurality of comparators, each comparator including:
   a first transition decision unit for detecting the transitions of corresponding data by comparing the corresponding past data with the corresponding data;
   a second transition decision unit for outputting a high transition signal representing that the corresponding data is transited from a logic low level to a logic high level; and
   a third transition decision unit for outputting a low transition signal representing that the corresponding data is transited from a logic high level to a logic low level.

19. The semiconductor memory device as recited in claim 16, wherein the up slew rate control information includes an up slew rate control signal enabled when the number of transitions of the data from a logic low level to a logic high level is larger than a predetermined value, for controlling the drivability of the pull-up pre-driver by adjusting resistance provided in the pull-up pre-driver; and the down slew rate control information includes a down slew rate control signal enabled when the number of transitions of the data from a logic high level to a logic low level is larger than a predetermined value, for controlling the drivability of the pull-down pre-driver by adjusting resistance provided in the pull-down pre-driver.

20. The semiconductor memory device as recited in claim 17, wherein the counting unit includes:
   a first counter for counting the number of transitions of the data from a logic low level to a logic high level;
   a first signal generator for generating the up slew rate control signal based on an output of the first counter when the number of transitions is larger than the predetermined value;
   a second counter for counting the number of transitions of the data from a logic high level to a logic low level; and
   a second signal generator for generating the down slew rate control signal based on an output of the second counter when the number of transitions is larger than the predetermined value.

21. The semiconductor memory device as recited in claim 20, wherein the first and the second counters includes a plurality of half-adders.

22. The semiconductor memory device as recited in claim 16, wherein the up slew rate control information includes a plurality of up slew rate control signals, each signal enabled according to the number of transitions of the data from a logic low level to a logic high level, for controlling the drivability of the pull-up pre-driver by adjusting resistance provided in the pull-up pre-driver; and the down slew rate control information includes a plurality of down slew rate control signals, each signal enabled according to the number of transitions of the data from a logic high level to a logic low level, for controlling the drivability of the pull-down pre-driver by adjusting resistance provided in the pull-down pre-driver.

23. The semiconductor memory device as recited in claim 17, wherein the counting unit includes:
   a first counter including a plurality of half-adders and full-adders, for outputting the plurality of up slew rate control signals; and
   a second counter including a plurality of half-adders and full-adders, for outputting the plurality of down slew rate control signals.

* * * * *